(12) United States Patent
Zhang et al.

(10) Patent No.: US 9,190,260 B1
(45) Date of Patent: Nov. 17, 2015

(54) TOPOLOGICAL METHOD TO BUILD SELF-ALIGNED MTJ WITHOUT A MASK

(71) Applicant: GLOBALFOUNDRIES Inc., Grand Cayman (KY)

(72) Inventors: Xunyuan Zhang, Albany, NY (US); Ruilong Xie, Albany, NY (US); Xiuyu Cai, Niskayuna, NY (US); Seowoo Nam, Delmar, NY (US); Hyun-Jin Cho, Palo Alto, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/540,504

(22) Filed: Nov. 13, 2014

(51) Int. Cl.
*H01L 43/12* (2006.01)
*H01L 21/02* (2006.01)
*H01L 27/22* (2006.01)

(52) U.S. Cl.
CPC .............. *H01L 21/02* (2013.01); *H01L 27/222* (2013.01); *H01L 27/228* (2013.01)

(58) Field of Classification Search
CPC ........ H01L 21/02; H01L 27/222; H01L 27/228
See application file for complete search history.

(56) References Cited

U.S. PATENT DOCUMENTS

| | | | |
|---|---|---|---|
| 8,629,494 B2 * | 1/2014 | Kim et al. | 257/334 |
| 9,029,170 B2 * | 5/2015 | Li | 438/3 |
| 2011/0233696 A1 * | 9/2011 | Li | 257/421 |

* cited by examiner

*Primary Examiner* — Long Pham
(74) *Attorney, Agent, or Firm* — Ditthavong & Steiner, P.C.

(57) ABSTRACT

A method of forming a self-aligned MTJ without using a photolithography mask and the resulting device are provided. Embodiments include forming a first electrode over a metal layer, the metal layer recessed in a low-k dielectric layer; forming a MTJ layer over the first electrode; forming a second electrode over the MTJ layer; removing portions of the second electrode, the MTJ layer, and the first electrode down to the low-k dielectric layer; forming a silicon nitride-based layer over the second electrode and the low-k dielectric layer; and planarizing the silicon nitride-based layer down to the second electrode.

14 Claims, 7 Drawing Sheets

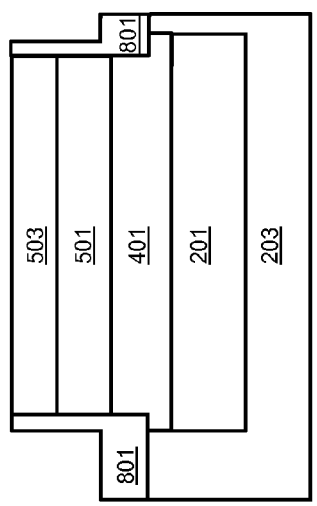
FIG. 9
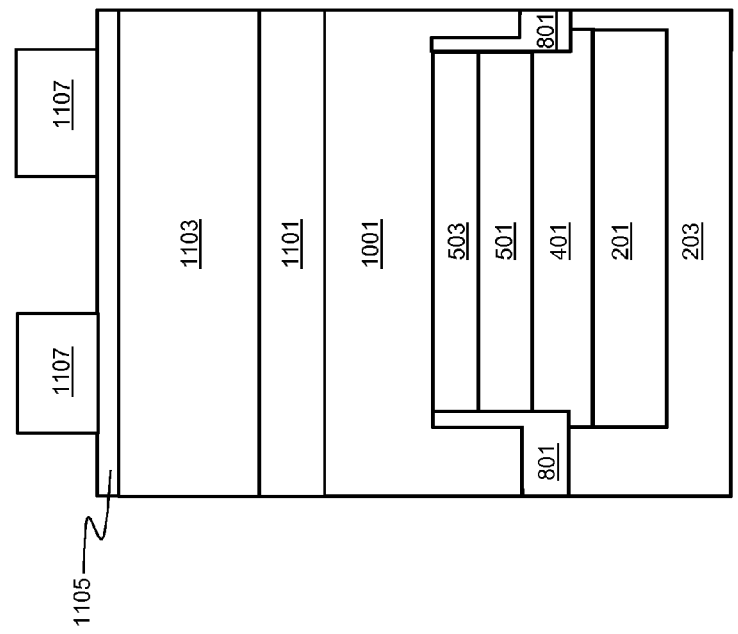
FIG. 10
FIG. 11

TOPOLOGICAL METHOD TO BUILD SELF-ALIGNED MTJ WITHOUT A MASK

TECHNICAL FIELD

The present disclosure relates to memory design for semiconductor devices. The present disclosure is particularly applicable to fabricating 28 nanometer (nm) and beyond spin-transfer torque magnetic random-access memory (STT-MRAM).

BACKGROUND

A typical MRAM structure includes a simple 1-transistor and 1-magnetic tunnel junction (MTJ) memory cell. The MTJ is formed between metal (Mx) layers, e.g., Mx and Mx+1, and the state of a bit is detected as a change in resistance.

Such an approach for forming a MTJ is illustrated in FIG. 1. Adverting to FIG. 1, metal layer 101, e.g., Mx, is formed in interlayer dielectric (ILD) 103. A metal cap 105 is then formed over the metal layer 101 and ILD 103. Next, a bottom electrode (BE) dielectric 107 is formed over the metal cap 105. Thereafter, a BE electrode 109 is formed over the metal layer 101. A MTJ 111 is then formed between the BE electrode 109 and a top electrode (TE) 113. Next, a passivation layer 115 is formed over edges of the MTJ 111 and the TE 113, and over the BE 109. Thereafter, a tetraethyl orthosilicate (TEOS) layer 117 is formed over the passivation layer 115 and the metal cap 105. A metal layer etch stop layer 119 and a metal layer 121, e.g., Mx+1, are then formed over the TEOS layer 117 and the TE 113. Further, a TEOS layer 123 is formed over the metal layer 121 and the metal layer etch stop layer 119. The described process flow requires three (3) different lithography masks to fabricate, which are costly and time consuming in terms of wafer processing.

A need therefore exists for methodology enabling fabrication of a self-aligned MTJ without using lithography masks and the resulting device.

SUMMARY

An aspect of the present disclosure is a process of forming a self-aligned MTJ without using a lithography mask.

Another aspect of the present disclosure is a self-aligned MTJ device.

A further aspect of the present disclosure is a process of forming a high-density self-aligned MTJ with no additional lithography mask other than the lithography masks designed to form Mx+1 metal.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a first electrode over a metal layer, the metal layer recessed in a low-k dielectric layer; forming a MTJ layer over the first electrode; forming a second electrode over the MTJ layer; removing portions of the second electrode, the MTJ layer, and the first electrode down to the low-k dielectric layer; forming a silicon nitride-based layer over the second electrode and the low-k dielectric layer; and planarizing the silicon nitride-based layer down to the second electrode.

Aspects of the present disclosure include recessing the metal layer in the low-k dielectric layer by wet etching to a depth of 5 nm to 50 nm. Other aspects include forming the first and second electrodes and the MTJ layer by directional deposition with minimal sidewall coverage. Further aspects include removing the portions of the second electrode, the MTJ layer, and the first electrode by: forming a second silicon nitride-based layer over the second electrode; planarizing the other silicon nitride-based layer down to the second electrode, a remaining portion of the other silicon nitride-based layer located above the metal layer; and etching the second electrode, the MTJ layer, and the first electrode down to the low-k dielectric layer on either side of the remaining portion of the other silicon nitride-based layer. Another aspect includes forming a second metal layer by dual-damascene patterning while a trench is being formed above the second electrode to have electrical contact. Additional aspects include forming the second metal layer by: forming an ultra-low-k (ULK) dielectric layer over the planarized silicon nitride-based layer and the second electrode; etching a trench and a via in the ULK; and forming the second metal layer in the trench and the via.

Another aspect of the present disclosure is a device including: a low-k dielectric layer; a metal layer recessed in the low-k dielectric layer; a first electrode formed on the metal layer; a self-aligned MTJ formed on the first electrode; a second electrode formed on the MTJ; and a silicon nitride-based layer formed on the low-k dielectric substrate and adjacent to an outer edge of the first electrode, the MTJ, and the second electrode.

Aspects of the device include the metal layer being recessed 5 nm to 50 nm in the low-k dielectric layer. Other aspects include the self-aligned MTJ being formed to a width of 20 nm to 50 nm. Further aspects include a second metal layer being formed by dual-damascene patterning while a trench is being formed above the second electrode to have electrical contact. Another aspect includes a ULK dielectric layer being formed on each side and adjacent to the second metal layer. Additional aspects include the first and second electrode being formed of tantalum (Ta).

A further aspect of the present disclosure is a method including: forming a first electrode over a first metal layer, the first metal layer recessed in a low-k dielectric layer; forming a MTJ layer over the first electrode; forming a second electrode over the MTJ layer; removing portions of the second electrode, the MTJ layer, and the first electrode down to the low-k dielectric layer; forming a silicon nitride-based layer over the second electrode and the low-k dielectric layer; forming patterning stacks on the silicon nitride-based layer and the second electrode, the patterning stacks being laterally separated; forming trenches in place of the patterning stacks; and forming a second metal layer above the first metal layer and the MTJ layer and in the trenches.

Aspects of the present disclosure include recessing the first metal layer in the low-k dielectric layer by wet etching to a depth of 5 nm to 50 nm. Other aspects include forming the first and second electrodes and the MTJ layer by directional deposition with minimal sidewall coverage. Further aspects include removing the portions of the second electrode, the MTJ layer, and the first electrode by: forming a second silicon nitride-based layer over the second electrode; planarizing the other silicon nitride-based layer down to the second electrode, a remaining portion of the other silicon nitride-based layer located above the first metal layer; and etching the second electrode, the MTJ layer, and the first electrode down to the low-k dielectric layer on each side of the remaining portion of the other silicon nitride-based layer. Additional aspects include forming the patterning stacks by: planarizing the silicon nitride-based layer down to the second electrode; forming an ultra-low-k (ULK) dielectric layer over the planarized silicon nitride-based layer and the second electrode; forming a hard mask layer over the ULK layer; forming an organic planarization layer (OPL) over the ULK layer; forming a silicon-containing anti-reflective coating (SiARC) layer over the OPL layer; forming photoresist features corresponding to the patterning stacks on the SiARC layer, the photoresist features being laterally separated from each other; etching the SiARC, OPL, hard mask, and ULK layers down to the second electrode and silicon nitride-based layer using the photoresist features; and removing the photoresist features, the SiARC and OPL layers. Another aspect includes etching the second electrode and the MTJ layer between the stacks down to the first electrode. Other aspects include forming the trenches by: forming a passivation layer over the patterning stacks, the silicon nitride-based layer, and the first electrode; forming an oxide layer over the passivation layer; planarizing the oxide layer down to the hard mask layer; recessing the oxide and passivation layers; forming a second hard mask layer over the oxide and passivation layers and in each recess; planarizing the other hard mask layer down to the hard mask layer; and etching the hard mask, the second hard mask layer, the ULK, and the passivation layers down to the second electrode. Further aspects include forming the second metal layer by: dual-damascene patterning.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 9 through 17 schematically illustrate a process for forming a high-density self-aligned MTJ device without using any additional lithography masks other than the masks designed to form Mx+1 dual-damascene structures, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of costly and time consuming use of one or more lithography masks attendant upon fabricating a MTJ structure.

Methodology in accordance with embodiments of the present disclosure includes a first electrode being formed over a metal layer, the metal layer recessed in a low-k dielectric layer. A MTJ layer is formed over the first electrode. A second electrode is formed over the MTJ layer and portions of the second electrode, the MTJ layer, and the first electrode are removed down to the low-k dielectric layer. A silicon nitride-based layer is formed over the second electrode and the low-k dielectric layer and the silicon nitride-based layer is then planarized down to the second electrode.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
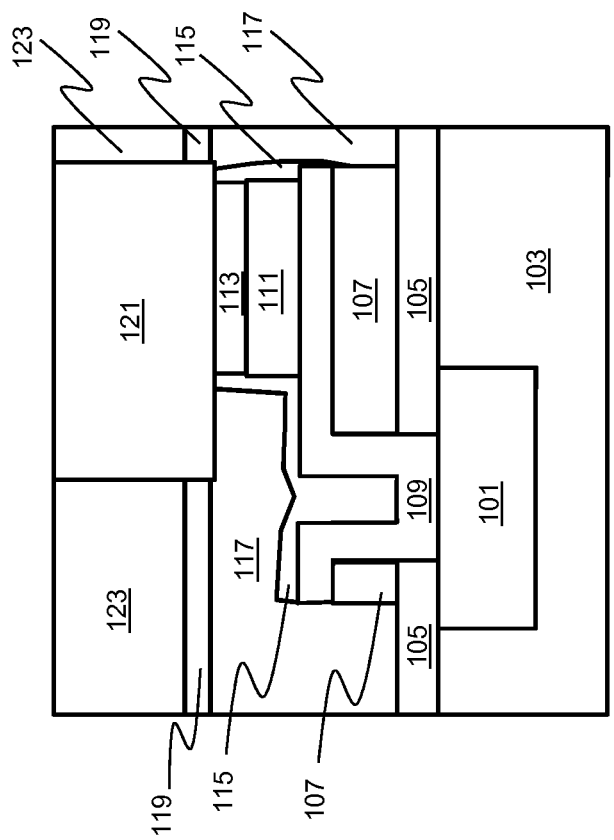
FIG. 1 schematically illustrates a background MTJ device.
Figure 2:
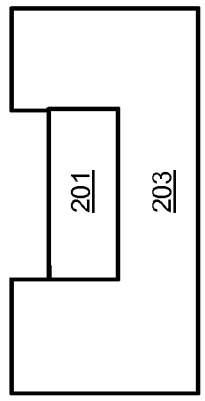
FIGS. 2 through 8 schematically illustrate a process flow for forming a self-aligned MTJ device without using a lithography mask, in accordance with an exemplary embodiment.
Figure 3:
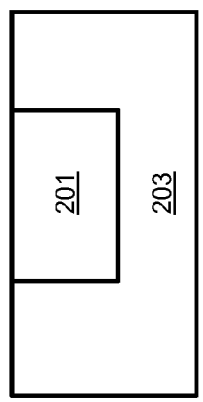
Figure 5:
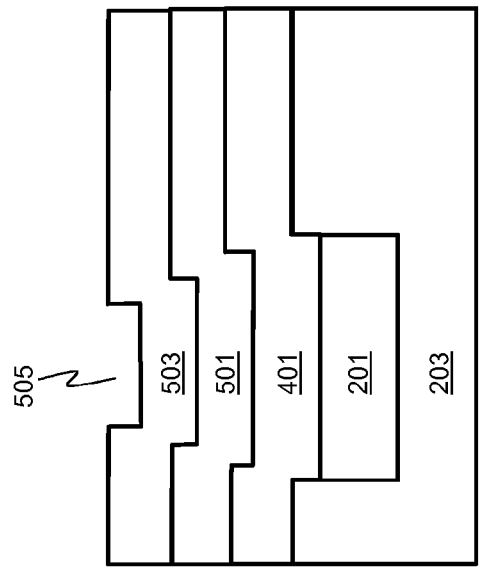
Figure 4:
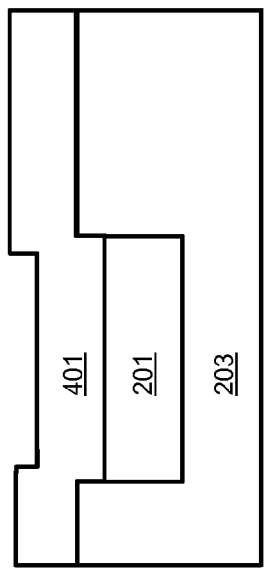

Adverting to FIG. 2, after back-end-of-line (BEOL) bottom layer chemical mechanical polishing (CMP), a metal layer 201, e.g., Mx formed of copper (Cu), is formed in a low-k dielectric layer 203, e.g., silicon oxide ($SiO_2$) doped with carbon and phosphorous. The metal layer 201 is then recessed, e.g., 5 nm to 50 nm, in the low-k dielectric layer 203, as depicted in FIG. 3. (FIG. 2 and FIG. 3 are cross-sectional views in the direction of the Mx metal line width). The metal layer 201 is recessed, for example, by wet etching. Next, an electrode 401 is deposited over the metal layer 201 and the low-k dielectric layer 203, as illustrated in FIG. 4. (FIG. 4 is a cross-sectional view in the direction of the Mx metal line length). Line length is equal or longer than line width but less than 3 times of the line width. The electrode 401 may be formed, e.g., of Ta, and to a thickness of 5 nm to 20 nm. Thereafter, a MTJ layer 501 is deposited over the electrode 401, as depicted in FIG. 5. The MTJ layer 501 may be formed, for example, of a metal and oxide compound, e.g., magnesium oxide (MgO), and to a thickness of 20 nm to 50 nm. Next, an electrode 503 is deposited over the MTJ layer 501. The electrode 503 may be formed, for example, to a thickness of 5 nm to 20 nm. The electrode 401, the MTJ layer 501, and the electrode 503 are formed by directional deposition with minimal sidewall coverage, resulting in a recess 505 in the electrode 503 having a width, for example, of 30 nm to 80 nm.

Figure 7:
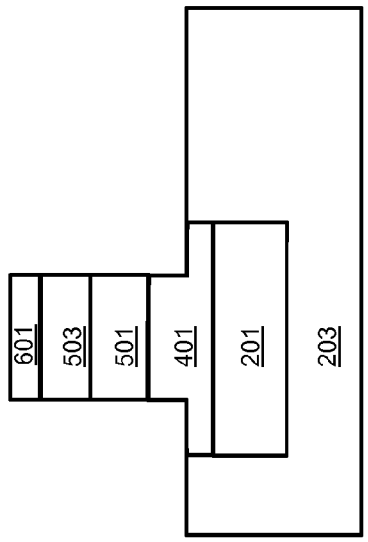
Figure 6:
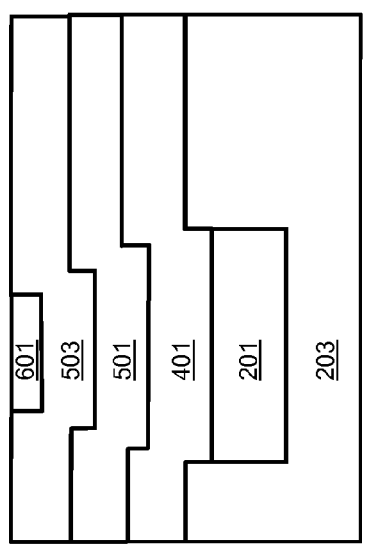
Figure 8:
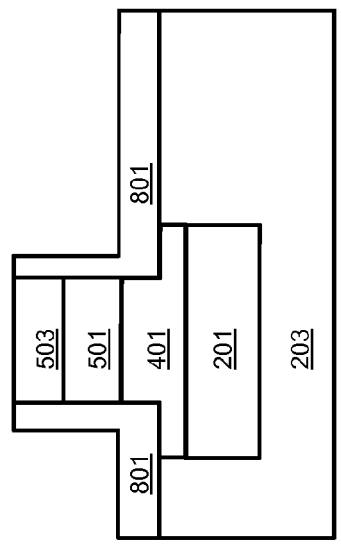

Adverting to FIG. 6, a silicon nitride-based layer 601 is deposited over the electrode 503 and then planarized, e.g., by CMP, down to an upper surface of the electrode 503. Next, portions of the electrode 503, the MTJ layer 501, and the electrode 401 are removed on both sides of the silicon nitride-based layer 601 down to an upper surface of the low-k dielectric layer 203, as depicted in FIG. 7. A silicon nitride-based layer 801 is formed, e.g., by deposition, over all exposed surfaces and then planarized, e.g., by CMP, down to the electrode 503, as depicted in FIG. 8. The silicon nitride-based layer 801 may be formed, for example, to a thickness of 10 nm to 20 nm. Thereafter, a second metal layer (not shown for illustrative convenience), e.g., Mx+1 formed of Cu, may be formed above the second electrode using standard metal dual-damascene processes. For example, a passivation layer (not shown for illustrative convenience) may be formed on the silicon nitride-based layer 801. Next, a ULK layer (not shown for illustrative convenience) may be formed on the passivation layer. Trenches and vias may then be etched into the ULK layer. Thereafter, the second metal layer, e.g., Mx+1, (not shown for illustrative convenience) may be formed in the vias and trenches. A trench physically contacts with the second electrode. Vias in other positions (not shown for illustrative convenience) build the electrical contact between Mx+1 and Mx metal layers. The Mx+1 metal line width is similar to the Mx metal line layer 201 in FIGS. 2 and 3. However, Mx+1 is perpendicular to Mx.

Adverting to FIG. 9, where the metal layer 201 is much greater in length than width, e.g., at least 3 times greater, the density of the MTJ layer 501 may be increased by patterning the upper level of the device. FIG. 9 follows the steps of FIG. 2 through FIG. 8, however, each layer, e.g., layers 203, 201, 401, 501, and 503, is now at least 3 times greater in length than the respective layers in FIGS. 2 through 3. Adverting to FIG. 10, after the silicon nitride-based layer 801 is planarized in FIG. 8, a ULK dielectric layer 1001 is deposited over the silicon nitride-based layer 801 and electrode 503 and then planarized for the next metal layer formation, e.g., Mx+1. The ULK dielectric layer 1001 may be formed, e.g., to a thickness of 50 nm to 200 nm.

A hard mask layer 1101 is formed, e.g., of a silicon oxide with a higher mass density than the ULK layer 1001, over the ULK layer 1001, as depicted in FIG. 11. The hard mask layer 1101 may be formed, for example, to a thickness of 10 nm to 30 nm. An OPL layer 1103 is then formed, e.g., to a thickness of 100 nm to 300 nm, over the ULK layer 1001. Next, a SiARC layer 1105, is formed, e.g., to a thickness of 20 nm to 50 nm, over the OPL layer 1103. Thereafter, photoresist features 1107 are formed over the SiARC layer 1105. The photoresist features 1107 may be formed, for example, to a thickness of 100 nm to 300 nm and to a width of 20 nm to 50 nm. In addition, the photoresist features 1107 may be formed, for example, with a space of 20 nm to 50 nm therebetween. The ULK layer 1001, the hard mask layer 1101, the OPL layer 1103, the SiARC layer 1105, and the photoresist features 1107 are formed to be used for inverted tone patterning of the next metal layer, e.g., Mx+1.

Figure 13:
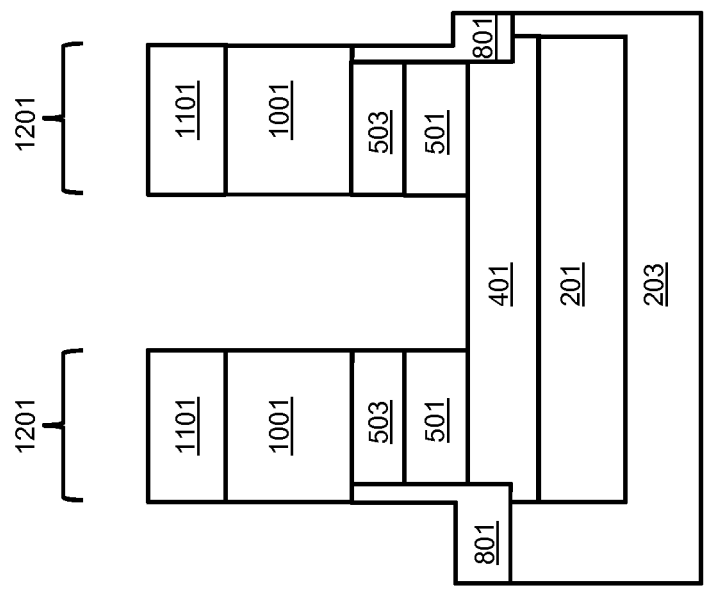
Figure 12:
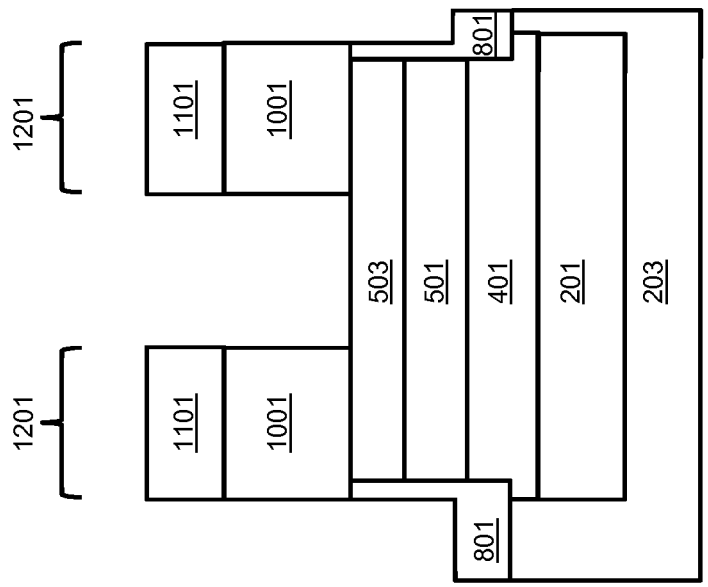
Figure 14:
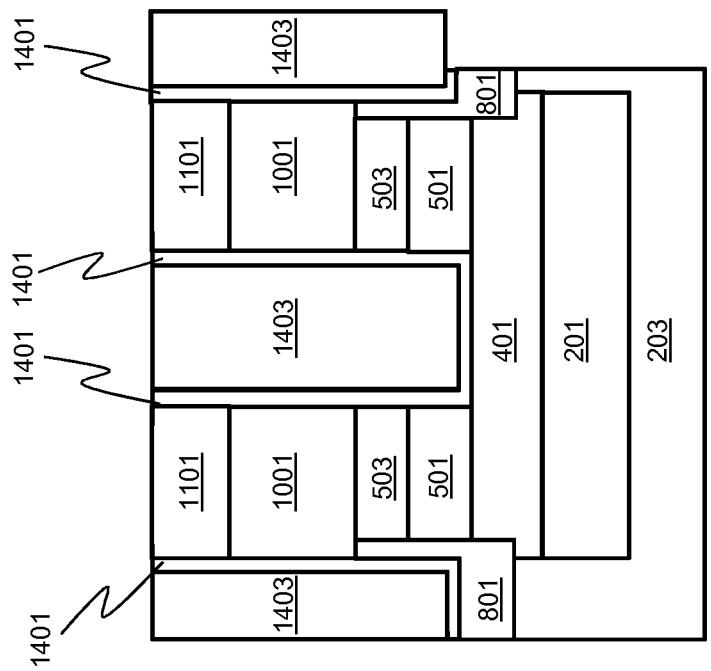

Next, patterning stacks 1201 may be formed, for example, by etching the SiARC layer 1105, the OPL layer 1103, the hard mask layer 1101, and the ULK layer 1001 down to electrode 503 and the silicon nitride-based layer 801 using photoresist features 1107 as a mask, as depicted in FIG. 12. The photoresist features 1107, the SiARC layer 1105, and the OPL layer 1103 may then be removed. Thereafter, the electrode 503 and the MTJ layer 501 may be etched, for example, between the patterning stacks 1201 down to the electrode 401, as depicted in FIG. 13. Adverting to FIG. 14, a passivation layer 1401 is formed over the patterning stacks 1201, the silicon nitride-based layer 801, and the electrode 401. The passivation layer 1401 may be formed, for example, in-situ to a thickness of 5 nm to 20 nm. Next, an oxide layer 1403, e.g., flowable oxide, is formed over the passivation layer 1401. The passivation layer 1401 and the oxide layer 1403 are then planarized, e.g., by CMP, down to the hard mask layer 1101.

Figure 15:
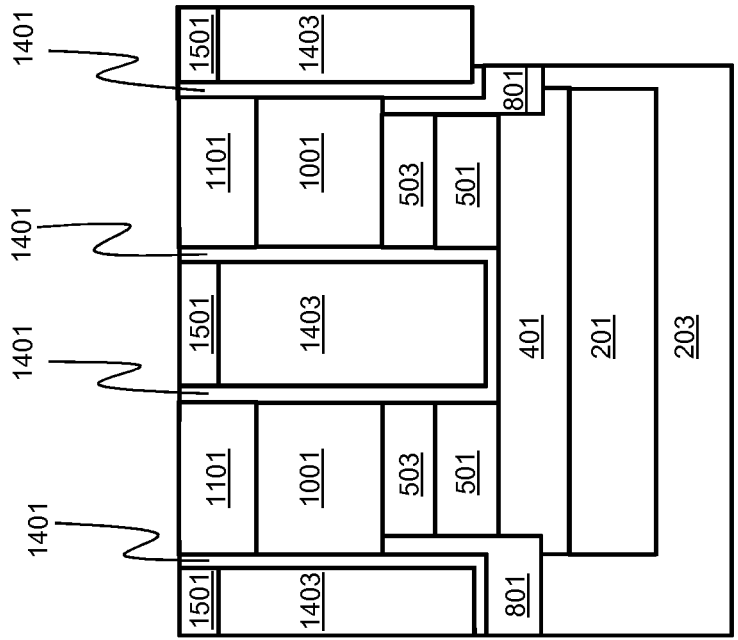
Figure 17:
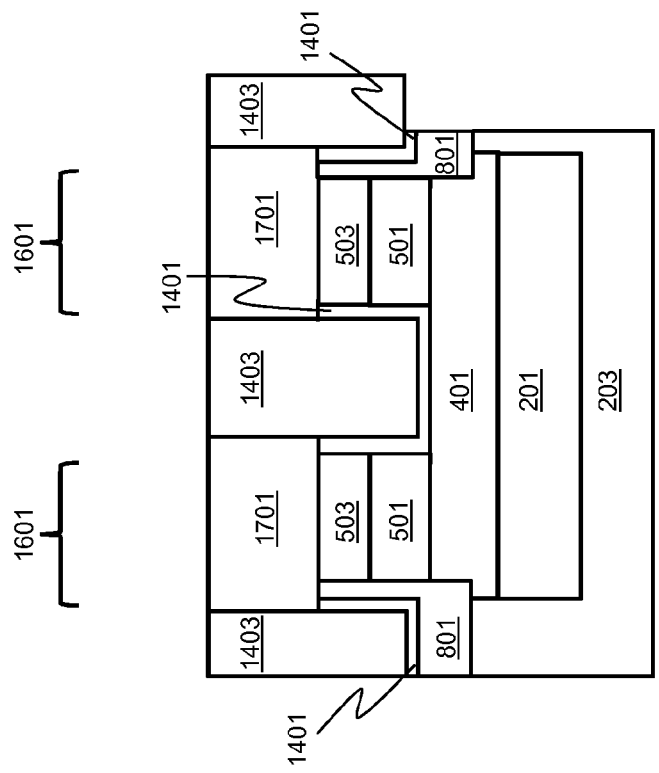
Figure 16:
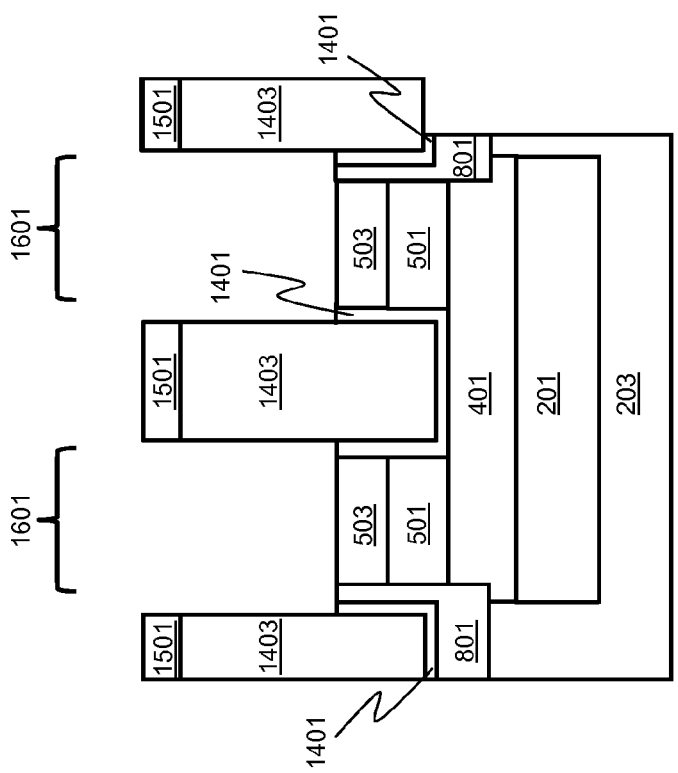

Adverting to FIG. 15, the oxide layer 1403 is then recessed, e.g., 10 nm to 30 nm. Next, a hard mask layer 1501, e.g., TiN, is formed over the oxide layer 1403. The hard mask layer 1501 is then planarized, e.g., by CMP, down to hard mask layer 1101. Thereafter, the hard mask layer 1501 is used as a hard mask for dual-damascene patterning by forming vias and trenches. The hard mask layer 1101, the ULK 1001, and the passivation layer 1401 are etched down to the electrode 503, forming trenches 1601. Next, metal layer 1701, e.g., Mx+1 formed of Cu, is formed in the trenches 1601, as depicted in FIG. 17. The hard mask layer 1501 may then be removed and the oxide layer 1403 and the metal layer 1701 are then planarized, e.g., by CMP. The metal layer 1701 may be formed, for example, by a dual-damascene patterning process. The resulting device of FIG. 17 is similar to the resulting device of FIG. 7, except the density of the MTJ 501 has been doubled based on the greater length of the metal layer 201 in FIG. 9 compared to the length of the metal layer 201 in FIG. 2. This is an example and even a higher density of the MTJ 501 may be formed depending on the ratio between the length of metal layer 201 in FIG. 9 and the width of Cu line in Mx+1.

The embodiments of the present disclosure can achieve several technical effects including formation of either a self-aligned MTJ or a high-density self-aligned MTJ without using a photolithography mask. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices in the 28 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a first electrode over a metal layer, the metal layer recessed in a low-k dielectric layer;
   forming a magnetic tunnel junction (MTJ) layer over the first electrode;
   forming a second electrode over the MTJ layer;
   removing portions of the second electrode, the MTJ layer, and the first electrode down to the low-k dielectric layer;
   forming a silicon nitride-based layer over the second electrode and the low-k dielectric layer; and
   planarizing the silicon nitride-based layer down to the second electrode.

2. The method according to claim 1, comprising recessing the metal layer in the low-k dielectric layer by wet etching to a depth of 5 nanometer (nm) to 50 nm.

3. The method according to claim 1, comprising forming the first and second electrodes and the MTJ layer by directional deposition with minimal sidewall coverage.

4. The method according to claim 1, comprising removing the portions of the second electrode, the MTJ layer, and the first electrode by:
   forming a second silicon nitride-based layer over the second electrode;
   planarizing the other silicon nitride-based layer down to the second electrode, a remaining portion of the other silicon nitride-based layer located above the metal layer; and etching the second electrode, the MTJ layer, and the first electrode down to the low-k dielectric layer on each side of the remaining portion of the other silicon nitride-based layer.

5. The method according to claim 1, further comprising forming a second metal layer by dual-damascene patterning while a trench is being formed above the second electrode to have electrical contact.

6. The method according to claim 5, comprising forming the second metal layer by:
   forming an ultra-low-k (ULK) dielectric layer over the planarized silicon nitride-based layer and the second electrode;
   etching a trench and a via in the ULK; and
   forming the second metal layer in the trench and the via.

7. A method comprising:
   forming a first electrode over a first metal layer, the first metal layer recessed in a low-k dielectric layer;
   forming a magnetic tunnel junction (MTJ) layer over the first electrode;
   forming a second electrode over the MTJ layer;
   removing portions of the second electrode, the MTJ layer, and the first electrode down to the low-k dielectric layer;
   forming a silicon nitride-based layer over the second electrode and the low-k dielectric layer;
   forming patterning stacks on the silicon nitride-based layer and the second electrode, the patterning stacks being laterally separated;
   forming trenches in place of the patterning stacks; and
   forming a second metal layer above the first metal layer and the MTJ layer and in the trenches.

8. The method according to claim 7, comprising recessing the first metal layer in the low-k dielectric layer by wet etching to a depth of 5 nanometer (nm) to 50 nm.

9. The method according to claim 7, comprising forming the first and second electrodes and the MTJ layer by directional deposition with minimal sidewall coverage.

10. The method according to claim 7, comprising removing the portions of the second electrode, the MTJ layer, and the first electrode by:
    forming a second silicon nitride-based layer over the second electrode;
    planarizing the other silicon nitride-based layer down to the second electrode, a remaining portion of the other silicon nitride-based layer located above the first metal layer; and
    etching the second electrode, the MTJ layer, and the first electrode down to the low-k dielectric layer on each side of the remaining portion of the other silicon nitride-based layer.

11. The method according to claim 7, comprising forming the patterning stacks by:
    planarizing the silicon nitride-based layer down to the second electrode;
    forming an ultra-low-k (ULK) dielectric layer over the planarized silicon nitride-based layer and the second electrode;
    forming a hard mask layer over the ULK layer;
    forming an organic planarization layer (OPL) over the ULK layer;
    forming a silicon-containing anti-reflective coating (SiARC) layer over the OPL layer;
    forming photoresist features corresponding to the patterning stacks on the SiARC layer, the photoresist features being laterally separated from each other;
    etching the SiARC, OPL, hard mask, and ULK layers down to the second electrode and silicon nitride-based layer using the photoresist features; and
    removing the photoresist features, the SiARC and OPL layers.

12. The method according to claim 7, further comprising etching the second electrode and the MTJ layer between the patterning stacks down to the first electrode.

13. The method according to claim 11, comprising forming the trenches by:
    forming a passivation layer over the patterning stacks, the silicon nitride-based layer, and the first electrode;
    forming an oxide layer over the passivation layer;
    planarizing the oxide layer down to the hard mask layer;
    recessing the oxide and passivation layers;
    forming a second hard mask layer over the oxide and passivation layers and in each recess;
    planarizing the other hard mask layer down to the hard mask layer; and
    etching the hard mask, the second hard mask layer, the ULK, and the passivation layers down to the second electrode.

14. The method according to claim 7, comprising forming the second metal layer by: dual-damascene patterning.

* * * * *